United States Patent
Hashimoto et al.

(10) Patent No.: US 10,301,993 B2
(45) Date of Patent: May 28, 2019

(54) HYBRID VEHICLE

(71) Applicant: TOYOTA JIDOSHA KABUSHIKI KAISHA, Toyota-shi, Aichi-ken (JP)

(72) Inventors: Keita Hashimoto, Toyota (JP); Takahiro Suzuki, Okazaki (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 34 days.

(21) Appl. No.: 15/491,425

(22) Filed: Apr. 19, 2017

(65) Prior Publication Data

US 2017/0306821 A1   Oct. 26, 2017

(30) Foreign Application Priority Data

Apr. 20, 2016 (JP) ................. 2016-084431

(51) Int. Cl.
| | |
|---|---|
| *G01R 19/00* | (2006.01) |
| *F01N 3/20* | (2006.01) |
| *F01N 11/00* | (2006.01) |
| *F01N 9/00* | (2006.01) |
| *B60W 20/50* | (2016.01) |

(Continued)

(52) U.S. Cl.
CPC ............. *F01N 3/2026* (2013.01); *B60K 6/46* (2013.01); *B60L 1/00* (2013.01); *B60L 11/1861* (2013.01); *B60W 20/50* (2013.01); *F01N 9/00* (2013.01); *F01N 11/00* (2013.01); *F02D 41/222* (2013.01); *G01R 19/0092* (2013.01); *G01R 31/006* (2013.01); *B60L 11/1816* (2013.01); *B60L 2210/14* (2013.01); *B60L 2210/30* (2013.01); *B60L 2230/12* (2013.01); *B60Y 2200/92* (2013.01); *F01N 2550/22* (2013.01); *F01N 2560/12* (2013.01); *F01N 2900/0602* (2013.01); *Y02T 10/40* (2013.01); *Y10S 903/905* (2013.01);
(Continued)

(58) Field of Classification Search
CPC .................................................... B60W 20/50
See application file for complete search history.

(56) References Cited

U.S. PATENT DOCUMENTS

| 5,555,725 A | 9/1996 | Shimasaki et al. |
|---|---|---|
| 2008/0094762 A1 | 4/2008 | Ochiai |

(Continued)

FOREIGN PATENT DOCUMENTS

| DE | 10 2011 122 440 A1 | 6/2012 |
|---|---|---|
| DE | 10 2014 219 807 A1 | 3/2016 |

(Continued)

*Primary Examiner* — Genna M Mott
(74) *Attorney, Agent, or Firm* — Sughrue Mion, PLLC

(57) ABSTRACT

An electrically heated catalyst device has a catalyst that purifies exhaust gas from an engine, and is configured to heat the catalyst with electric power that is supplied from an electric storage device. A current sensor detects a current that is supplied to the electrically heated catalyst device. A current sensor detects an input/output current of the electric storage device. A controller executes failure determination control to determine whether the current sensor has a failure. In the failure determination control, the controller estimates a current that is supplied to the electrically heated catalyst device using a detection value of the current sensor and compares the estimated current with a detection value of the current sensor to determine whether the current sensor has a failure.

8 Claims, 10 Drawing Sheets

(51) Int. Cl.
*B60K 6/46* (2007.10)
*B60L 1/00* (2006.01)
*B60L 11/18* (2006.01)
*F02D 41/22* (2006.01)
*G01R 31/00* (2006.01)

(52) U.S. Cl.
CPC ........ *Y10S 903/906* (2013.01); *Y10S 903/907* (2013.01)

(56) References Cited

U.S. PATENT DOCUMENTS

| | | |
|---|---|---|
| 2013/0249283 A1 | 9/2013 | Yokoyama |
| 2014/0290216 A1* | 10/2014 | Katsuta ................. B60K 6/445 60/274 |
| 2015/0075142 A1* | 3/2015 | Hashimoto ............ B01D 53/50 60/300 |
| 2016/0126573 A1* | 5/2016 | Yoon ................. H01M 8/04686 324/537 |

FOREIGN PATENT DOCUMENTS

| | | |
|---|---|---|
| EP | 1 859 528 A1 | 11/2007 |
| EP | 2 716 885 A1 | 4/2014 |
| JP | 08-061048 A | 3/1996 |
| JP | 2007-258018 A | 10/2007 |
| JP | 2015-175759 A | 10/2015 |
| KR | 10-1610534 B1 | 4/2016 |
| WO | 2006100992 A1 | 9/2006 |
| WO | 2012/081330 A1 | 6/2012 |
| WO | 2012/164715 A1 | 12/2012 |

\* cited by examiner

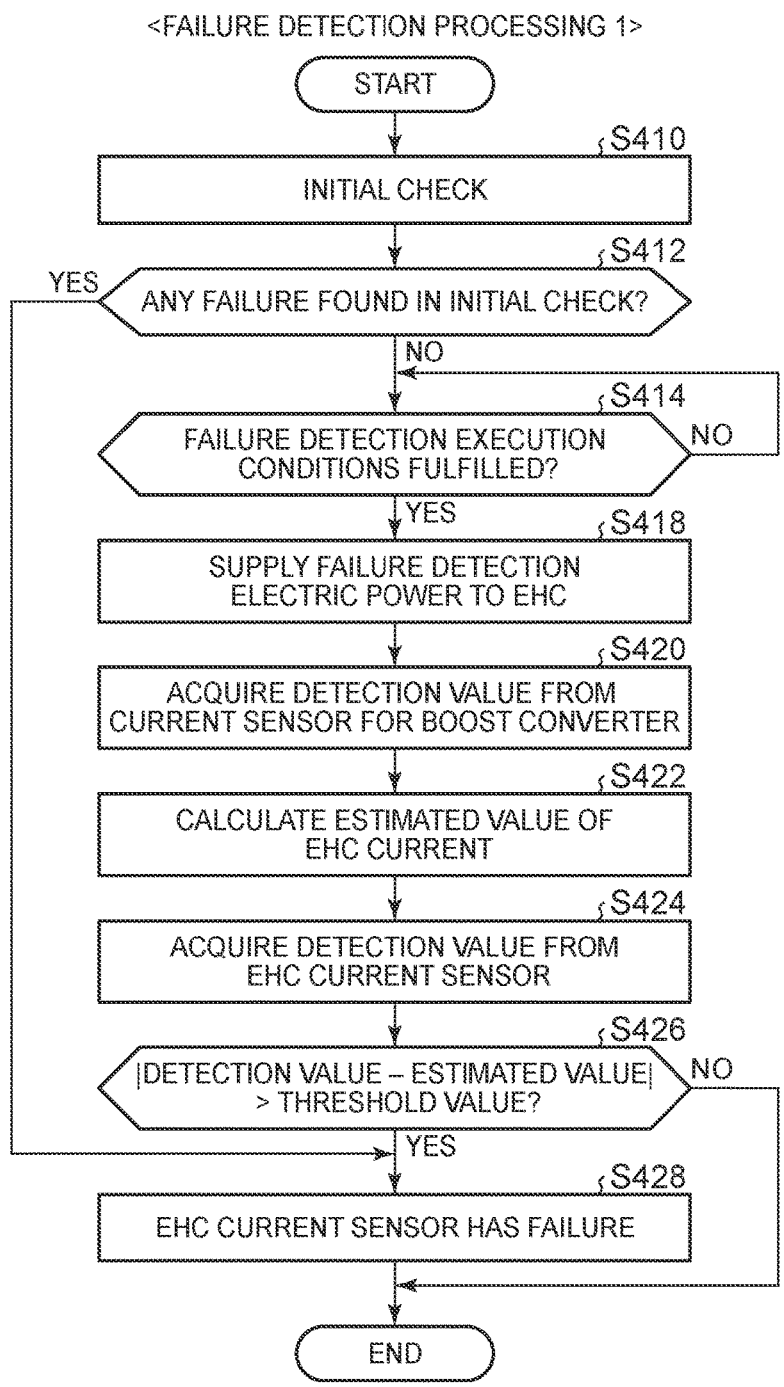

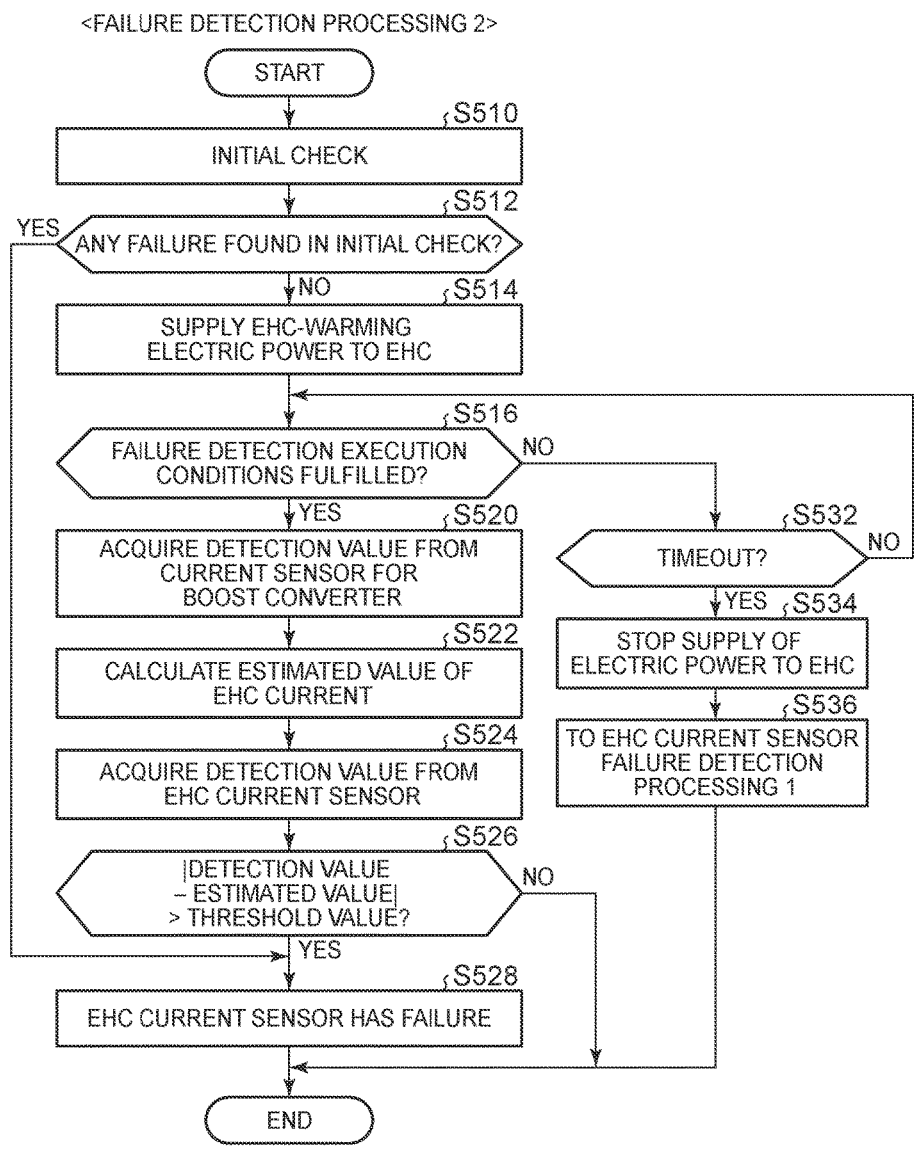

HYBRID VEHICLE

INCORPORATION BY REFERENCE

The disclosure of Japanese Patent Application No. 2016-084431 filed on Apr. 20, 2016 including the specification, drawings and abstract is incorporated herein by reference in its entirety.

BACKGROUND

1. Technical Field

The technical field relates to a hybrid vehicle, and, more particularly, to a hybrid vehicle that is equipped with an internal combustion engine and a vehicle-propelling electric motor.

2. Description of Related Art

Vehicles that are equipped with an internal combustion engine generally include a catalyst that purifies exhaust gas from the internal combustion engine in an exhaust passage. When the catalyst has not reached its activating temperature, the catalyst cannot purify exhaust gas sufficiently. This is the reason why electrically heated catalysts (which may be hereinafter referred to also as "EHCs") have been proposed which are configured to be able to heat a catalyst electrically to warm it up before the internal combustion engine is started.

Japanese Patent Application Publication No. 8-61048 (JP 8-61048 A) discloses a controller for such an EHC. The controller detects the operating conditions of the EHC based on, for example, a catalyst voltage that is applied to the EHC, a catalyst current that flows through the EHC, and a catalyst temperature that is calculated based on the catalyst voltage and the catalyst current, and can detect a failure of the EHC based on the result of the detection (refer to JP 8-61048 A).

When a current sensor that detects the current that is supplied to the EHC (which may be hereinafter referred to also as "EHC current sensor") has a failure, the electric power that is supplied to the EHC cannot be detected correctly and the following problems may occur. For example, when the EHC current sensor indicates a value that is higher than the actual current value, the supply of electric power to the EHC can be deficient. Then, the exhaust gas purification performance of the EHC may be lowered because the EHC may not be sufficiently warmed up. On the other hand, when the EHC current sensor indicates a value that is lower than the actual current value, the supply of electric power to the EHC can be excessive. Then, overheated areas may be formed locally in the EHC and the resulting heat stress may cause cracks in the base material of the EHC.

It is, therefore, necessary to detect a failure of the EHC current sensor. However, making the EHC current sensor redundant for detection of a failure of the EHC current sensor leads to a problem, such as an increase in cost or the scale of equipment, which may impair the merchantability of the vehicle. Such problems are not specifically discussed in JP 8-61048 A.

SUMMARY

It is, therefore, an object of the disclosure to provide a hybrid vehicle in which a failure of an EHC current sensor can be detected without making the EHC current sensor redundant.

A hybrid vehicle according to one aspect of the disclosure is a hybrid vehicle that is equipped with an internal combustion engine and an electric motor generating a driving force and further includes an electric storage device, an electrically heated catalyst device, first and second current sensors, and a controller. The electric storage device stores electric power that is supplied to the electric motor. The electrically heated catalyst device includes a catalyst that purifies exhaust gas from the internal combustion engine, and is configured to be supplied with electric power from the electric storage device to electrically heat the catalyst. The first current sensor (EHC current sensor) detects a current that is supplied to the electrically heated catalyst device. The second current sensor detects an input/output current of the electric storage device. The controller executes failure determination control that estimates a current that is supplied to the electrically heated catalyst device using a detection value of the second current sensor and compares the estimated current with a detection value of the first current sensor to determine whether the first current sensor has a failure.

In this hybrid vehicle, a current that is supplied to the electrically heated catalyst device is estimated using a detection value of the second current sensor, which detects an input/output current of the electric storage device, and the estimated current is compared with a detection value of the first current sensor (EHC current sensor) to detect a failure of the first current sensor. Thus, there is no need to make the first current sensor redundant for determining whether the first current sensor has a failure. According to this hybrid vehicle, a failure of the first current sensor can be detected without making the first current sensor redundant.

The hybrid vehicle according to this aspect may be a hybrid vehicle that is equipped with an internal combustion engine and an electric motor generating a driving force and further includes an electric storage device, an inverter, a converter, an electrically heated catalyst device, first and second current sensors, and a controller. The electric storage device stores electric power that is supplied to the electric motor. The inverter drives the electric motor. The converter is provided between the electric storage device and the inverter. The electrically heated catalyst device includes a catalyst that purifies exhaust gas from the internal combustion engine, and is configured to be supplied with electric power from a power line that connects the converter and the inverter to electrically heat the catalyst. The first current sensor (EHC current sensor) detects a current that is supplied to the electrically heated catalyst device. The second current sensor detects a current that is supplied from the electric storage device to the converter. The controller executes failure determination control that estimates a current that is supplied to the electrically heated catalyst device using a detection value of the second current sensor and compares the estimated current with a detection value of the first current sensor to determine whether the first current sensor has a failure.

In this hybrid vehicle, a current that is supplied to the electrically heated catalyst device is estimated using a detection value of the second current sensor, which detects a current that is supplied from the electric storage device to the converter, and the estimated current is compared with a detection value of the first current sensor (EHC current sensor) to determine whether the first current sensor has a failure. Thus, there is no need to make the first current sensor redundant for determining whether the first current sensor has a failure. According to this hybrid vehicle, a failure of the first current sensor can be detected without making the first current sensor redundant.

The hybrid vehicle may run either in a CD (Charge Depleting) mode or a CS (Charge Sustaining) mode. The failure determination control may include first processing that is executed (i) when the hybrid vehicle is in the CD mode and when the electric storage device has a state of charge (SOC) that is lower than a predetermined level and the catalyst of the electrically heated catalyst device has a temperature that is lower than a predetermined value, or (ii) when the hybrid vehicle is in the CS mode and when the catalyst has a temperature that is lower than the predetermined value and the internal combustion engine is not in operation. In the first processing, the controller may control electric power that is supplied to the electrically heated catalyst device so that first electric power that is required to determine whether the first current sensor has a failure and to warm up the electrically heated catalyst device is supplied.

In the CD mode, the internal combustion engine is controlled to be operated less frequently than in the CS mode, switching to the CS mode is made and the internal combustion engine is then started soon when the SOC falls below a predetermined level. On the other hand, in the CS mode, the internal combustion engine is operated as needed to maintain the SOC within a predetermined range. As described above, the conditions for starting the internal combustion engine are different between the CD mode and CS mode. However, according to this hybrid vehicle, when the catalyst has a temperature that is lower than a predetermined value, first electric power that is required to determine whether the first current sensor has a failure and to warm up the electrically heated catalyst device is be supplied to the electrically heated catalyst device irrespective of the selected mode (CD mode/CS mode).

More preferably, the failure determination control may further includes second processing that is executed when the hybrid vehicle is in the CD mode and when the electric storage device has an SOC that is equal to or higher than the predetermined level, or when the hybrid vehicle is in the CS mode and when the catalyst has a temperature that is equal to or higher than the predetermined value. In the second processing, the controller may control electric power that is supplied to the electrically heated catalyst device so that second electric power that is less than the first electric power can be supplied.

When the hybrid vehicle is in the CD mode and the SOC is equal to or higher than a predetermined level, there is no need to warm up the electrically heated catalyst device because the CD mode will be continued and the internal combustion engine is less likely to be started for the time being. In the CS mode, in which the internal combustion engine is operated as needed, there is no need to warm up the electrically heated catalyst device when the catalyst has a temperature that is equal to or higher than a predetermined value. In such a case, according to this hybrid vehicle, second electric power, which is less than the first electric power, only for determining whether the first current sensor has a failure can be supplied to the electrically heated catalyst device irrespective of the selected mode (CD mode/CS mode).

Preferably, the hybrid vehicle can run either in a CD mode or a CS mode. The failure determination control includes first processing that is executed when the hybrid vehicle is in the CD mode and when the electric storage device has an SOC that is lower than a predetermined level and the catalyst of the electrically heated catalyst device has a temperature that is lower than a predetermined value, and second processing that is executed when the hybrid vehicle is in the CD mode and when the electric storage device has an SOC that is equal to or higher than the predetermined level. In the first processing, the controller may controls electric power that is supplied to the electrically heated catalyst device so that first electric power that is required to determine whether the first current sensor has a failure and to warm up the electrically heated catalyst device is supplied. In the second processing, the controller may controls electric power that is supplied to the electrically heated catalyst device so that second electric power that is less than the first electric power can be supplied.

When the hybrid vehicle is in the CD mode and the SOC is equal to or higher than a predetermined level, there is no need to warm up the electrically heated catalyst device because the CD mode will be continued and the internal combustion engine is less likely to be started for the time being. Then, switching to the CS mode is made and the internal combustion engine is then started soon when the SOC falls below a predetermined level. In this hybrid vehicle, the necessity for warm-up of the electrically heated catalyst device is determined in a way suitable for the CD mode, and the first or second processing as described above is executed. Thus, according to this hybrid vehicle, a failure of the first current sensor can be detected in a way suitable for the CD mode.

The hybrid vehicle may run either in a CD mode or a CS mode. The failure determination control includes first processing that is executed when the hybrid vehicle is in the CS mode and when the catalyst of the electrically heated catalyst device has a temperature that is lower than the predetermined value and the internal combustion engine is not in operation, and second processing that is executed when the hybrid vehicle is in the CS mode and when the catalyst has a temperature that is equal to or higher than the predetermined value. In the first processing, the controller may controls electric power that is supplied to the electrically heated catalyst device so that first electric power that is required to determine whether the first current sensor has a failure and to warm up the electrically heated catalyst device is supplied. In the second processing, the controller may controls electric power that is supplied to the electrically heated catalyst device so that second electric power that is less than the first electric power can be supplied.

When the hybrid vehicle is in the CS mode, in which the internal combustion engine is operated as needed to maintain the SOC within a predetermined range, the electrically heated catalyst device needs warm-up when the catalyst has a temperature that is lower than a predetermined value and the internal combustion engine is not in operation whereas the electrically heated catalyst device does not need warm-up when the catalyst has a temperature that is equal to or higher than the predetermined value. As described above, in this hybrid vehicle, the necessity for warm-up of the electrically heated catalyst device is determined in a way suitable for the CS mode, and the first or second processing as described above is executed. Thus, according to this hybrid vehicle, a failure of the first current sensor can be detected in a way suitable for the CS mode.

According to an aspect of the disclosure, there can be provided a hybrid vehicle in which a failure of an EHC current sensor can be detected without making the EHC current sensor redundant.

BRIEF DESCRIPTION OF THE DRAWINGS

Features, advantages, and technical and industrial significance of exemplary embodiments will be described below with reference to the accompanying drawings, in which like numerals denote like elements, and wherein:

FIG. 9 is a flowchart that illustrates the procedure of failure detection processing 1 that is executed in the second embodiment; and FIG. 10 is a flowchart that illustrates the procedure of failure detection processing 2 that is executed in the second embodiment.

DETAILED DESCRIPTION OF EMBODIMENTS

Figure 1:
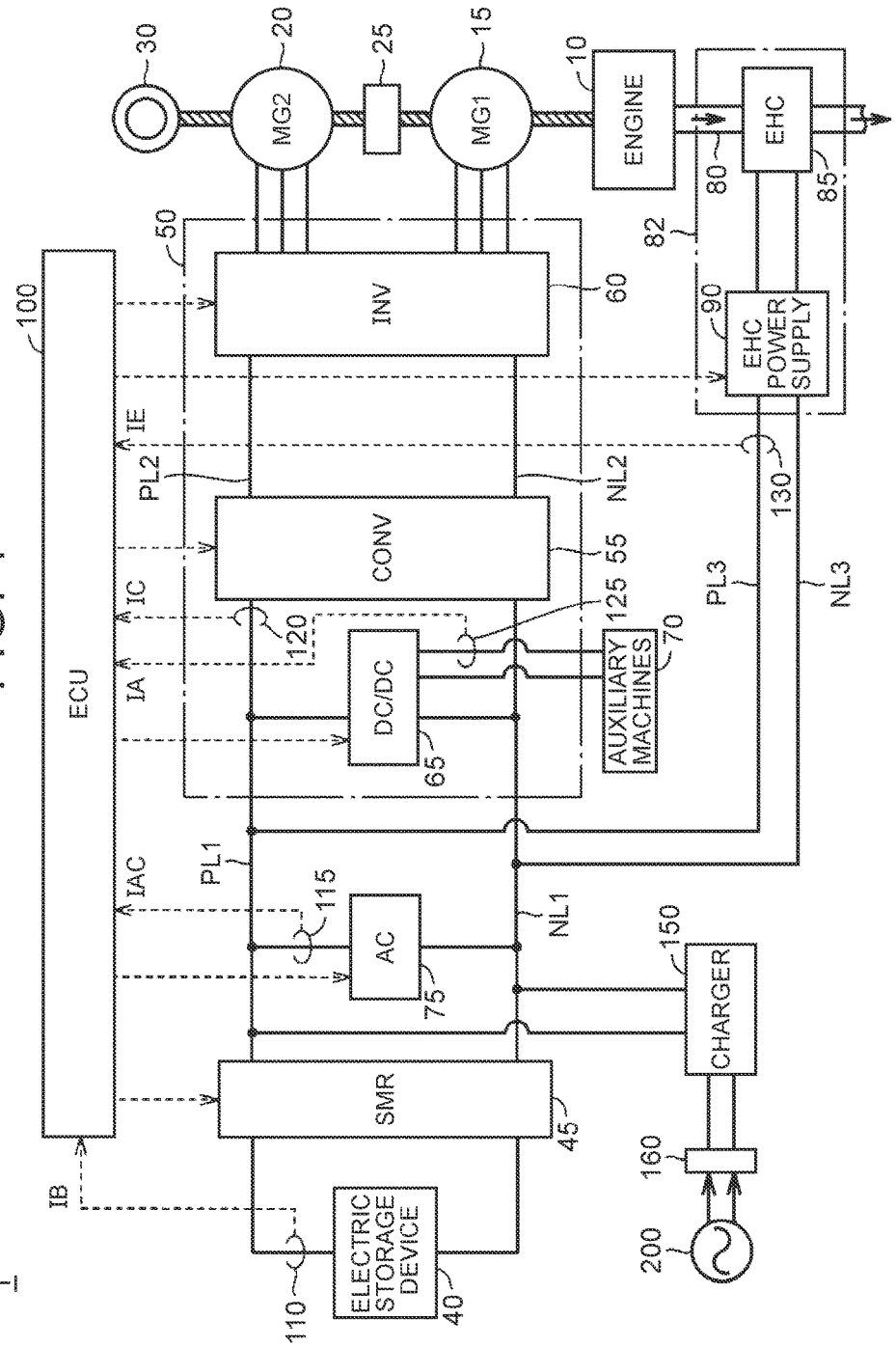
FIG. 1 is an overall configuration diagram of a hybrid vehicle according to a first embodiment.

Embodiments are hereinafter described in detail with reference to the drawings. The same or corresponding parts are designated by the same reference numerals in all the drawings and their description is not repeated.

First Embodiment

FIG. 1 is an overall configuration diagram of a hybrid vehicle according to a first embodiment. Referring to FIG. 1, a hybrid vehicle 1 includes an engine 10, motor generators 15 and 20, a power split device 25, driving wheels 30, an exhaust passage 80, and an EHC device 82.

The engine 10 is an internal combustion engine that outputs power by converting combustion energy that is generated by burning an air-fuel mixture into kinetic energy of a moving element such as a piston or rotor.

The motor generators 15 and 20 are AC rotating electric machines, such as three-phase AC synchronous electric motors with permanent magnets that are buried in a rotor. The motor generator 15 is used as a power generator that is driven by the engine 10 via the power split device 25, and also as an electric motor for starting the engine 10. The motor generator 20 operates primarily as an electric motor to drive the driving wheels 30. When the hybrid vehicle 1 is braked or the acceleration of the hybrid vehicle 1 is decreased on a descending slope, the motor generator 20 operates as a power generator to perform regenerative power generation.

The power split device 25 includes a planetary gear mechanism that has three rotating shafts, a sun gear, a carrier and a ring gear, for example. The power split device 25 splits the drive power from the engine 10 into two parts. A portion of the power is transmitted to the rotating shaft of the motor generator 15 and the rest of the power is transmitted to the driving wheels 30.

The EHC device 82 includes an EHC 85 and an EHC power supply 90. The EHC 85 is provided in the exhaust passage 80 of the engine 10. The EHC 85 has a catalyst that purifies exhaust gas from the engine 10, and is configured to heat the catalyst with electric power that is supplied from the EHC power supply 90. The EHC power supply 90 changes the voltage of electric power that is supplied from an electric storage device 40 through paired power lines PL3 and NL3 to the rated voltage of the EHC 85 and supplies the electric power to the EHC 85.

Figure 2:
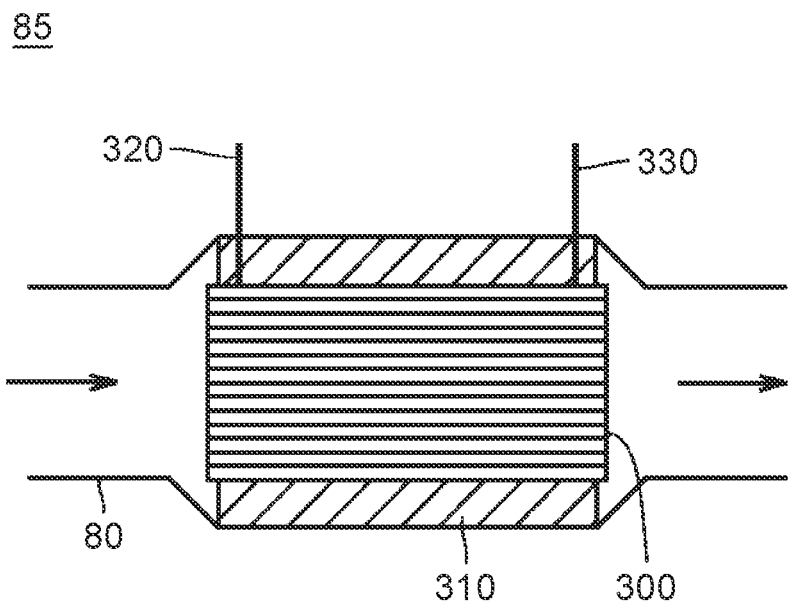
FIG. 2 is a diagram that illustrates the configuration of an EHC.

FIG. 2 is a diagram that illustrates the configuration of the EHC 85. In FIG. 2, a cross-section of the EHC 85 that is taken along the direction of exhaust gas flow is shown. Referring to FIG. 2, the EHC 85 includes a catalyst carrier 300, an insulation member 310, and electrodes 320 and 330.

The catalyst carrier 300 is incorporated in the exhaust passage 80, and is constituted of a conductive member with the shape of a circular or ellipsoidal cylinder or the like that has a honeycomb structure in a cross-section perpendicular to the direction of exhaust gas flow, for example. A three-way catalyst, an oxidation catalyst or the like (not shown) is supported on the catalyst carrier 300, and harmful components in the exhaust gas that passes through the EHC 85 are removed by the catalyst carrier 300.

The insulation member 310 is provided between an outer peripheral surface of the catalyst carrier 300 and an inner peripheral surface of the exhaust passage 80, and is constituted of a member that has electrical insulating properties and heat insulating properties. An insulating material, such as alumina, is used as the insulation member 310.

The electrode 320 is electrically connected to the catalyst carrier 300 at an upstream end of the catalyst carrier 300 with respect to the direction of exhaust gas flow. The electrode 330 is electrically connected to the catalyst carrier 300 at a downstream end of the catalyst carrier 300 with respect to the direction of exhaust gas flow. The other ends of the electrodes 320 and 330 are connected to the EHC power supply 90 (FIG. 1). When a voltage is applied to the catalyst carrier 300 from the EHC power supply 90 through the electrodes 320 and 330, a current flows through the catalyst carrier 300 and the catalyst carrier 300 generates heat because of its electrical resistance. This raises the temperature of the three-way catalyst or oxidation catalyst that is supported on the catalyst carrier 300. Then, the EHC 85 becomes catalytically active and capable of purifying exhaust gas effectively.

The configuration of the EHC 85 is not limited to the one that is shown in FIG. 2, and various types of known EHCs are applicable to the EHC 85.

Referring again to FIG. 1, the hybrid vehicle 1 also includes an electric storage device 40, a system main relay (which may be hereinafter referred to also as "SMR") 45, a power control unit (which may be hereinafter referred to also as "PCU") 50, auxiliary machines 70, and an electric air conditioner 75. The hybrid vehicle 1 further includes an electronic control unit (which may be hereinafter referred to also as "ECU") 100, current sensors 110, 115, 120, 125 and 130, a charger 150, and a power receiving section 160.

The electric storage device 40 is a rechargeable DC power supply, and includes a secondary battery, such as a nickel hydrogen battery or lithium ion battery. The electric storage device 40 can supply electric power to the PCU 50, the electric air conditioner 75 and the EHC power supply 90. The electric storage device 40 is charged with electric power that is supplied from the motor generator 15 and/or the motor generator 20 via the PCU 50 when the motor generator 15 and/or the motor generator 20 are generating electric power. In addition, the electric storage device 40 can be charged with electric power that is supplied from an external power supply 200 via the power receiving section 160. A large-capacity capacitor may be employed as the electric storage device 40.

The state of charge (SOC) of the electric storage device 40 is represented by the percentage of the current amount of charge in the electric storage device 40 to its full-charge capacity, for example. The SOC is calculated based on an input/output current of the electric storage device 40 that is detected by a current sensor 110 and/or an output voltage of the electric storage device 40 that is detected by a voltage sensor (not shown), for example. The SOC may be calculated in an ECU that is additionally provided in the electric storage device 40 or may be calculated in the ECU 100 based on detection values of the input/output current and/or the output voltage of the electric storage device 40.

The SMR 45 is provided between the electric storage device 40 and paired power lines PL1 and NL1. The SMR 45 is energized to switch the hybrid vehicle 1 into a "ready-ON (drivable) state" in response to a control signal from the ECU 100 when the user operates a power switch (not shown) while depressing the brake pedal, for example.

The PCU 50 includes a boost converter 55, an inverter 60, and a DC/DC converter 65. The boost converter 55 is provided between the paired power lines PL1 and NL1 and paired power lines PL2 and NL2, and increases the voltage between the paired power lines PL2 and NL2 to a level that is equal to or higher than the voltage between the paired power lines PL1 and NL1 based on a control signal from the ECU 100. The boost converter 55 is constituted of a current-reversible boost chopper circuit, for example.

The inverter 60 is provided between the paired power lines PL2 and NL2 and the motor generators 15 and 20. The inverter 60 drives the motor generators 15 and 20 based on a control signal from the ECU 100. The inverter 60 is constituted of bridge circuits, each of which is provided for the corresponding one of the motor generators 15 and 20 and includes switching elements for three phases, for example.

The DC/DC converter 65 is connected to the paired power lines PL1 and NL1. The DC/DC converter 65 reduces the voltage of the electric power that is supplied from the paired power lines PL1 and NL1 to an auxiliary machine voltage and supplies the electric power to the auxiliary machines 70 based on a control signal from the ECU 100. The auxiliary machines 70 comprehensively represent various auxiliary machines and an auxiliary machine battery that are mounted in the hybrid vehicle 1.

The electric air conditioner 75 is connected to the paired power lines PL1 and NL1 and supplied with operating power from the electric storage device 40 through the paired power lines PL1 and NL1. The electric air conditioner 75 controls the temperature in the cabin of the hybrid vehicle 1 based on a control signal from the ECU 100.

The EHC power supply 90 is connected to the paired power lines PL1 and NL1 via the paired power lines PL3 and NL3 and supplied with electric power from the electric storage device 40 through the paired power lines PL1 and NL1 and the paired power lines PL3 and NL3. The EHC power supply 90 changes the voltage of the electric power from the paired power lines PL3 and NL3 to the rated voltage of the EHC 85 and supplies the electric power to the EHC 85 based on a control signal from the ECU 100.

The charger 150 is connected to the paired power lines PL1 and NL1. The charger 150 changes the voltage of electric power that is supplied from the external power supply 200 through the power receiving section 160 to a level suitable for the electric storage device 40 and outputs the electric power to the electric storage device 40 through the paired power lines PL1 and NL1 (the changing of the electric storage device 40 with the electric power from the external power supply 200 may be hereinafter referred to also as "external charging"). The charger 150 includes an AC/DC converter that converts the AC electric power that is supplied from the external power supply 200 through the power receiving section 160 to DC electric power, and a DC/DC converter that changes the voltage of the output from the AC/DC converter to a level suitable for the electric storage device 40, for example.

The power receiving section 160 receives electric power from the external power supply 200 and outputs the electric power to the charger 150. The power receiving section 160 may be constituted of an inlet to which a connector of a charging cable that is connected to the external power supply 200 is connectable, or a power-receiving coil that can receive electric power from a power transmitting coil provided on the external power supply 200 side through a magnetic field in a contactless manner.

The current sensor 110 detects a current IB that is input into or output from the electric storage device 40, and outputs a detection value corresponding to the current IB to the ECU 100. The current sensor 115 detects a current IAC that is supplied from the electric storage device 40 through the paired power lines PL1 and NL1 to the electric air conditioner 75 and outputs a detection value corresponding to the current IAC to the ECU 100. The current sensor 120 detects a current IC that is supplied from the electric storage device 40 through the paired power lines PL1 and NL1 to the boost converter 55 and outputs a detection value corresponding to the current IC to the ECU 100.

The current sensor 125 detects a current IA that is supplied from the electric storage device 40 through the DC/DC converter 65 to the auxiliary machines 70 and outputs a detection value corresponding to the current IA to the ECU 100. The current sensor 130 detects a current IE that is supplied from the electric storage device 40 through the paired power lines PL1 and NL1 and the paired power lines PL3 and NL3 to the EHC power supply 90 and outputs a detection value corresponding to the current IE to the ECU 100. In other words, the current sensor 130 is an EHC current sensor that detects a current IE that is supplied to the EHC device 82 (the current sensor 130 may be hereinafter referred to also as "EHC current sensor 130").

The ECU 100 includes a CPU (central processing unit), ROM (read only memory) in which processing programs and so on are stored, RAM (random access memory) in which data are temporarily stored, an input/output port through which various signals are input and output, and so on (all of which are not shown), and controls all the devices in the hybrid vehicle 1. The control of these devices may not necessarily be achieved by processing that is executed by software, and may be achieved by processing that is executed by dedicated hardware (electronic circuit).

One main control function of the ECU 100 is to control the running status of the hybrid vehicle 1 by selectively adopting a CD mode and a CS mode. The CD mode is a mode in which the SOC of the electric storage device 40 is preferentially consumed by mainly driving the hybrid vehicle 1 in EV (Electric Vehicle) mode while permitting the hybrid vehicle 1 to run in HV (Hybrid Vehicle) mode. The CS mode is a mode in which the SOC is controlled within a predetermined range by switching the hybrid vehicle 1 between the HV mode and the EV mode as appropriate. In the EV mode, the hybrid vehicle 1 is powered only by the motor generator 20 with the engine 10 stopped. In the HV mode, the hybrid vehicle 1 is powered by both the engine 10 and the motor generator 20.

Figure 3:
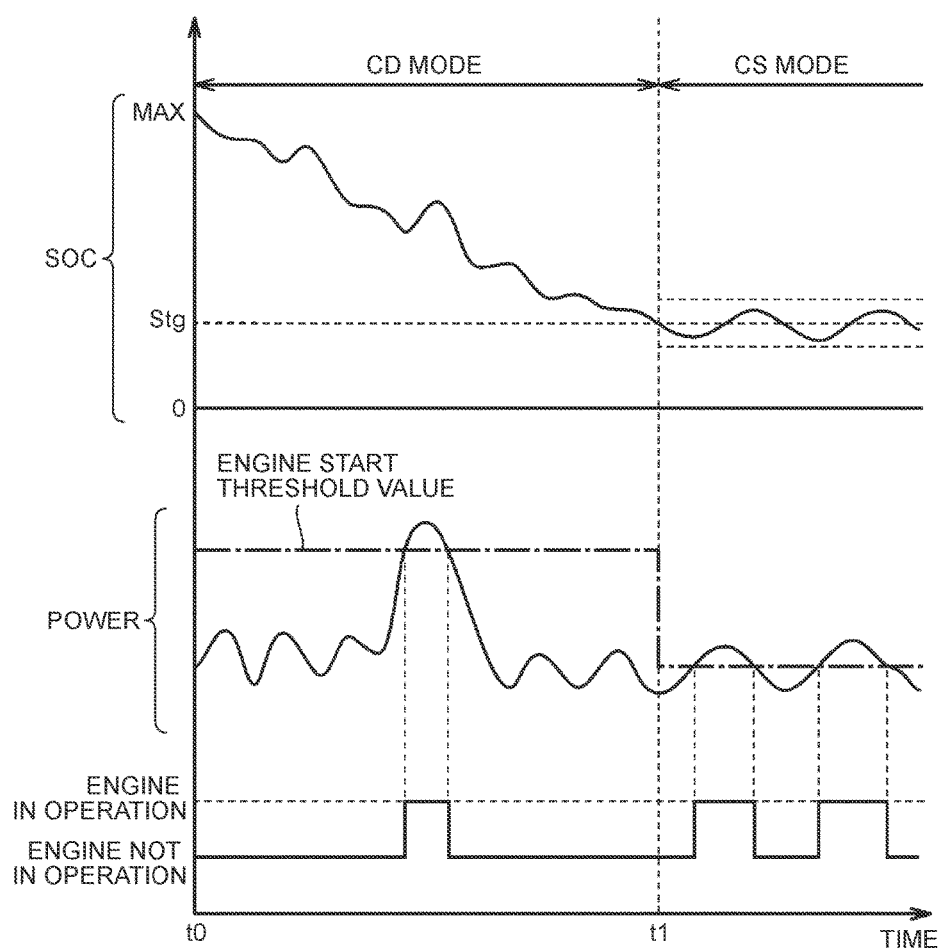
FIG. 3 is a diagram that illustrates a CD mode and a CS mode.

FIG. 3 is a diagram that illustrates the CD mode and CS mode. Referring to FIG. 3, suppose that the hybrid vehicle 1 starts to be driven in the CD mode (at time t0) after the electric storage device 40 is charged to full capacity (SOC=MAX) with electric power from the external power supply 200 through external charging.

The CD mode is a mode in which the SOC in the electric storage device 40 is preferentially consumed. In the CD mode, the electric power that has been stored in the electric storage device 40 (mainly, electrical energy that has been charged through external charging) is basically consumed. When the hybrid vehicle 1 is running in the CD mode, the engine 10 is not operated to maintain the SOC. Thus, although the SOC may temporarily increase because of the regenerative electric power that is recovered when, for example, the hybrid vehicle 1 is decelerated or the electric power that is generated during occasionally operation of the engine 10, the SOC eventually decreases as a whole as the travel distance increases because the discharge rate is relatively higher than the charge rate.

The CS mode is a mode in which the SOC of the electric storage device 40 is controlled within a predetermined range. As one example, when the SOC falls to a threshold value Stg that indicates a decrease in the SOC at time t1, the CS mode is selected so that the SOC can be thereafter maintained within a predetermined range. Specifically, the engine 10 is operated (HV mode) when the SOC decreases and the engine 10 is stopped (EV mode) when the SOC increases. In other words, in the CS mode, the engine 10 is operated to maintain the SOC. As described above, the engine 10 is operated as needed to maintain the SOC in the CS mode whereas in the CD mode, in which the engine 10 is not operated to maintain the SOC, the engine 10 is controlled to be operated less frequently than in the CS mode.

When the power that is required to propel the hybrid vehicle 1 is lower than a predetermined engine start threshold value, the hybrid vehicle 1 is powered by the motor generator 20 with the engine 10 stopped (EV mode). On the other hand, when the required power exceeds the engine start threshold value, the hybrid vehicle 1 runs with the engine 10 in operation (HV mode). In the HV mode, the hybrid vehicle 1 runs using the drive power from the engine 10 in addition to or instead of the drive power from the motor generator 20. The electric power that is generated by the motor generator 15, which is driven by the engine 10 while the hybrid vehicle 1 is running in the HV mode, is directly supplied to the motor generator 20 or stored in the electric storage device 40.

The engine start threshold value in the CD mode is preferably greater than the engine start threshold value in the CS mode. In other words, the region in which the hybrid vehicle 1 runs in the EV mode in the CD mode is preferably larger than the region in which the hybrid vehicle 1 runs in the EV mode in the CS mode. Then, in the CD mode, the frequency with which the engine 10 is started is further decreased and the opportunities for the hybrid vehicle 1 to run in the EV mode is further increased compared to those in the CS modes. On the other hand, in the CS mode, the hybrid vehicle 1 can be controlled so that it can be efficiently powered by both the engine 10 and the motor generator 20.

It should be noted that even when the hybrid vehicle 1 is in the CD mode, the engine 10 is operated when the required power exceeds the engine start threshold value, and is also permitted to be operated in some cases, such as to warm up the engine 10, even when the required power is not greater than the engine start threshold value. On the other hand, even when the hybrid vehicle 1 is in the CS mode, the engine 10 is stopped when the SOC increases to a certain level. In other words, the CD mode is not limited to the EV mode, in which the hybrid vehicle 1 runs with the engine 10 kept stopped, and the CS mode is not limited to the HV mode, in which the hybrid vehicle 1 runs with the engine 10 kept in operation. In both the CD mode and CS mode, the hybrid vehicle 1 can run either in the EV mode or the HV mode.

Referring again to FIG. 1, the ECU 100 executes failure determination control to determine whether the EHC current sensor 130, which detects a current IE that is supplied to the EHC device 82, has a failure. When the EHC current sensor 130 has a failure, the electric power that is supplied to the EHC 85 cannot be detected correctly and the following problems may occur. For example, when the EHC current sensor 130 provides a detection value that is higher than the actual current value, the supply of electric power to the EHC 85 can be deficient. Then, the exhaust gas purification performance of the EHC 85 may be lowered because the EHC 85 may not be sufficiently warmed up. On the other hand, when the EHC current sensor 130 provides a detection value that is lower than the actual current value, the supply of electric power to the EHC can be excessive. Then, overheated areas may be formed locally in the EHC 85 and the resulting heat stress may cause cracks in the catalyst carrier 300 (FIG. 2) of the EHC 85. It is, therefore, necessary to detect a failure of the EHC current sensor 130. However, making the EHC current sensor 130 redundant for detection of a failure of the EHC current sensor 130 leads to a problem, such as an increase in cost or the scale of equipment, which may impair the merchantability of the hybrid vehicle 1.

Thus, in the hybrid vehicle 1 according to this first embodiment, the ECU 100 estimates the current that is supplied from the electric storage device 40 to the EHC device 82 (which may be hereinafter referred to also as "EHC current") using a detection value from the existing current sensor 110, which detects an output current of the electric storage device 40. Then, the ECU 100 compares the estimated value of the EHC current with the detection value from the EHC current sensor 130, and determines that the EHC current sensor 130 has a failure when there is a difference between the estimated value and the detection value. This configuration makes it possible to detect a failure of the EHC current sensor 130 without making the EHC current sensor 130 redundant.

In the above failure determination control, the ECU 100 executes different processing for detecting a failure of the EHC current sensor 130 depending on the selected mode (CD mode/CS mode). Specifically, when the hybrid vehicle 1 is in the CD mode and the SOC is equal to or higher than a predetermined level, there is no need to warm up the EHC 85 because the CD mode will be continued and the engine 10 is less likely to be started for the time being. When the SOC falls below a predetermined level, switching to the CS mode is made and the engine 10 is then started soon. On the other hand, when the hybrid vehicle 1 is in the CS mode, in which the engine 10 is operated as needed to maintain the SOC within a predetermined range, the EHC 85 needs warm-up when the EHC 85 has a temperature that is lower than a predetermined value and the engine 10 is not in operation whereas the EHC 85 does not need warm-up if the EHC 85 has a temperature that is equal to or higher than the predetermined value.

The ECU 100 executes processing for detecting a failure of the EHC current sensor 130 in a way suitable for the selected mode depending on whether it is in CD mode or CS mode. Then, the ECU 100 executes different processing depending on whether the EHC 85 needs warm-up in the failure detection processing for each mode. Specifically, when the EHC 85 needs warm-up, the ECU 100 supplies electric power to the EHC device 82 to detect a failure of the EHC current sensor 130 while warming up the EHC 85. On the other hand, when the EHC 85 does not need warm-up, the ECU 100 supplies electric power to the EHC device 82 only for detection of a failure of the EHC current sensor 130 while detecting a failure of the EHC current sensor 130. In the following, the failure determination control that is executed by the ECU 100 to determine whether the EHC current sensor 130 has a failure is described in detail.

Figure 4:
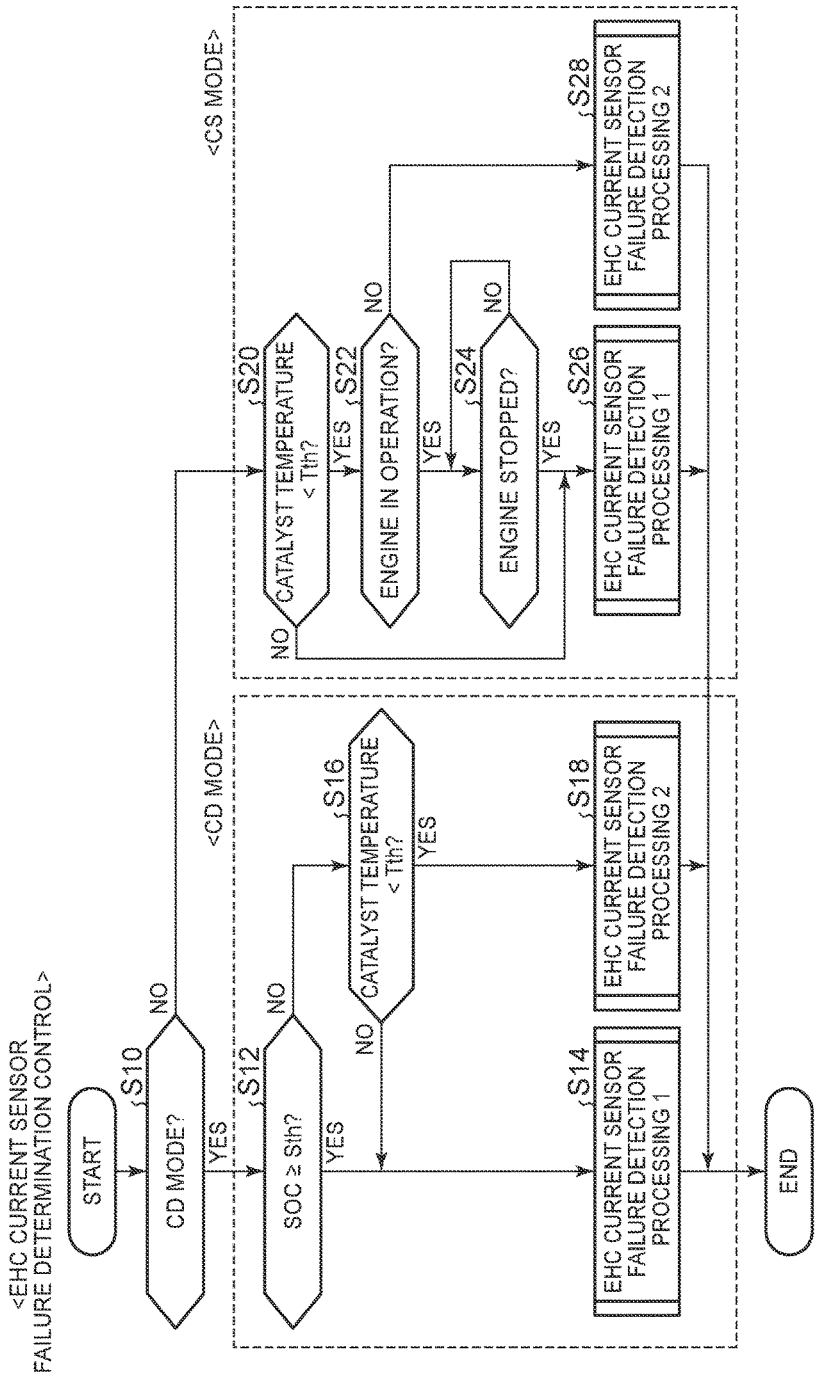
FIG. 4 is a flowchart that illustrates the processing procedure of EHC current sensor failure determination control that is executed by an ECU.

FIG. 4 is a flowchart that illustrates the processing procedure of failure determination control of EHC current sensor 130 that is executed by the ECU 100. This failure determination control is executed when the hybrid vehicle 1 is in a ready-ON state. For example, it is executed immediately after the hybrid vehicle 1 is switched from a ready-OFF state to a ready-ON state.

Referring to FIG. 4, the ECU 100 determines whether the CD mode has been selected (step S10). If it is determined that the CD mode has been selected (YES in step S10), the ECU 100 executes failure detection processing for CD mode. Specifically, the ECU 100 first determines whether the SOC of the electric storage device 40 is equal to or higher than a threshold value Sth (step S12). The threshold value Sth is an SOC determination value that is used to determine whether switching from the CD mode to the CS mode will be made soon because of a decrease in the SOC. For example, the threshold value Sth is set to a value slightly higher than the threshold value Stg (FIG. 3) at which switching from the CD mode to the CS mode is made because of a decrease in the SOC.

If it is determined in step S12 that the SOC is equal to or higher than the threshold value Sth (YES in step S12), it is determined that switching from the CD mode to the CS mode will not be made soon and the ECU 100 executes EHC current sensor failure detection processing 1 (which may be hereinafter referred to also simply as "failure detection processing 1") (step S14). In the failure detection processing 1, electric power is supplied to the EHC device 82 only for detection of a failure of the EHC current sensor 130 while failure detection is executed. In other words, when the SOC is equal to or higher than the threshold value Sth and the CD mode is therefore expected to continue for the time being, the EHC 85 does not need warm-up because the engine 10 is less likely to be started. Thus, in the failure detection processing 1, a relatively small amount of electric power is supplied to the EHC 85 only for detection of a failure of the EHC current sensor 130 while failure detection is executed. The failure detection processing 1 may be regarded as the "second processing". The failure detection processing 1 is described in detail later.

If it is determined in step S12 that the SOC is lower than the threshold value Sth (NO in step S12), the ECU 100 determines whether the temperature of the EHC 85 is lower than a threshold value Tth (step S16). This determination is made to check the warm-up condition of the EHC 85 because the hybrid vehicle 1 is soon switched to the CS mode, in which the engine 10 is operated as needed to maintain the SOC of the electric storage device 40 within a predetermined range, when the SOC falls below the threshold value Sth. The warm-up condition of the EHC 85 has to be checked because the EHC 85 may have been warmed up as a result of previous driving or an occasional operation of the engine 10 even in the CD mode, in which the engine 10 is less likely to be started. The temperature of the EHC 85 is detected by a temperature sensor (not shown), for example.

Then, if it is determined in step S16 that the temperature of the EHC 85 is lower than the threshold value Tth (YES in step S16), it is determined that the EHC 85 has not been warmed up and the ECU 100 executes EHC current sensor failure detection processing 2 (which may be hereinafter referred to also simply as "failure detection processing 2") (step S18). In the failure detection processing 2, electric power is supplied to the EHC device 82 to detect a failure of the EHC current sensor 130 while the EHC 85 is warmed up. In other words, because the engine 10 is operated as needed to maintain the SOC of the electric storage device 40 within a predetermined range in the CS mode, it is desirable that the EHC 85 has been warmed up preliminarily. Thus, in the failure detection processing 2, a larger amount of electric power than in the failure detection processing 1 is supplied to the EHC 85 so that a failure of the EHC current sensor 130 can be detected while the EHC 85 is warmed up. The failure detection processing 2 may be regarded as the "first processing". The failure detection processing 2 is also described in detail later.

If it is determined in step S16 that the temperature of the EHC 85 is equal to or higher than the threshold value Tth (NO in step S16), it is determined that the EHC 85 has been warmed up, and the ECU 100 advances the processing to step S14 and executes the failure detection processing 1. This is because a relatively small amount of electric power is necessary to be supplied to the EHC 85 only for detection of a failure of the EHC current sensor 130 when the EHC 85 has been warmed up.

On the other hand, if it is determined in step S10 that the CS mode has been selected (NO in step S10), the ECU 100 executes failure detection processing for CS mode. Specifically, the ECU 100 first determines whether the temperature of the EHC 85 is lower than the threshold value Tth (step S20). If it is determined that the temperature of the EHC 85 is equal to or higher than the threshold value Tth (NO in step S20), it is determined that the EHC 85 has been warmed up and the ECU 100 executes failure detection processing 1 (step S26). The failure detection processing 1 is the same as the processing that is executed in step S14 (described later).

If it is determined in step S20 that the temperature of the EHC 85 is lower than the threshold value Tth (YES in step S20), the ECU 100 determines whether the engine 10 is in operation (step S22). If it is determined that the engine 10 is in operation (YES in step S22), the ECU 100 waits until the engine 10 stops (step S24). This is because the loads of the auxiliary machines 70 are unstable and the accuracy of failure detection may be lowered while the engine 10 is in operation. Then, if it is determined that the engine 10 has stopped (YES in step S24), the ECU 100 determines that the EHC 85 has been warmed up by exhaust gas from the engine 10, and advances the processing to step S26 and executes the failure detection processing 1.

If it is determined in step S22 that the engine 10 is not in operation (NO in step S22), in other words, when the EHC 85 has not been warmed up and the engine 10 is not in operation, the ECU 100 executes failure detection processing 2 (step S28). The failure detection processing 2 is the same as the processing that is executed in step S18 (described later).

The failure detection processing 1 that is executed in step S14 and S26, and the failure detection processing 2 that is executed in step S18 and S28, are next described.

Figure 5:
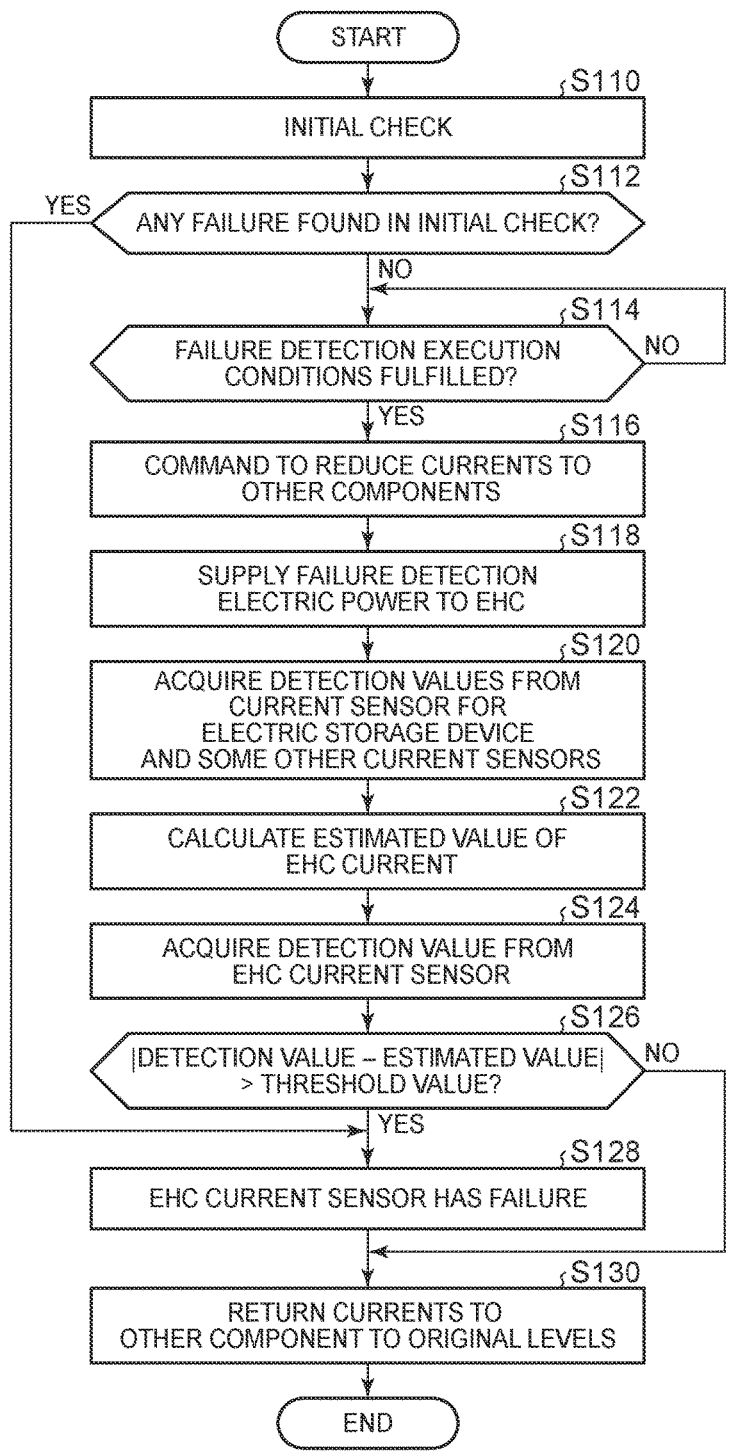
FIG. 5 is a flowchart that illustrates the procedure of failure detection processing 1 that is executed in steps S14 and S26 in FIG. 4.

FIG. 5 is a flowchart that illustrates the procedure of failure detection processing 1 that is executed in steps S14 and S26 in FIG. 4. Referring to FIG. 1 together with FIG. 5, the ECU 100 performs an initial check on the EHC current sensor 130 (step S110). In this initial check, it is checked whether zero-point learning of the EHC current sensor 130 has been completed and whether there is a break or short-circuit in the detection signal lines, for example. If it is determined that there is a failure found in the initial check (YES in step S112), the ECU 100 advances the processing to step S128 and determines that the EHC current sensor 130 has a failure.

If it is determined in step S112 that there is no failure found in the initial check (NO in step S112), the ECU 100 determines whether failure detection execution conditions are fulfilled (step S114). The execution conditions are described in detail later. Then, if it is determined that the failure detection execution conditions are fulfilled (YES in step S114), the ECU 100 detects a failure of the EHC current sensor 130 using a detection value from the current sensor 110, which detects an input/output current of the electric storage device 40. In other words, in this first embodiment, an EHC current that is supplied to the EHC device 82 is estimated using a detection value from the current sensor 110 and the estimated value of the EHC current is compared with a detection value from the EHC current sensor 130 to detect a failure of the EHC current sensor 130 as described below.

Specifically, the ECU 100 generates commands to reduce the currents that are supplied from the electric storage device 40 to other components except the EHC 85 (step S116). A detection value from the current sensor 110 includes, in addition to the EHC current that is supplied from the electric storage device 40 to the EHC device 82, the current that is supplied from the electric storage device 40 to the electric air conditioner 75, the current that is supplied from the electric storage device 40 via the DC/DC converter 65 to the auxiliary machines 70, and the current that is transmitted between the electric storage device 40 and the motor generators 15 and 20. Thus, in this first embodiment, the currents that are supplied from the electric storage device 40 to the electric air conditioner 75 and the auxiliary machines 70 (other components) are reduced during the failure detection in order to improve the accuracy of estimation of the EHC current using a detection value from the current sensor 110.

Because the EHC current is estimated by subtracting the currents that are supplied from the electric storage device 40 to the electric air conditioner 75 and the auxiliary machines 70 from a detection value from the current sensor 110 as described later, the currents that are supplied from the electric storage device 40 to the electric air conditioner 75 and the auxiliary machines 70 (other components) do not necessarily have to be reduced to 0. However, the accuracy of estimation of the EHC current can be improved by reducing these currents.

Specifically, the ECU 100 generates a command to reduce the power consumption of the electric air conditioner 75, and outputs the generated command to the electric air conditioner 75. If the electric air conditioner 75 can be turned off, the ECU 100 may output a command to turn off to the electric air conditioner 75. In addition, the ECU 100 generates a command to reduce the electric power that is supplied from the DC/DC converter 65 to the auxiliary machines 70, and outputs the generated command to the DC/DC converter 65. For example, the ECU 100 reduces the output voltage of the DC/DC converter 65 to a level lower than the voltage that is needed by the auxiliary machines 70. Then, the electric power that is supplied from the DC/DC converter 65 to the auxiliary machines 70 can be reduced to 0.

The reduction of the current that is transmitted between the electric storage device 40 and the motor generators 15 and 20 is not achieved by directly generating a command to reduce the current to or from the motor generators 15 and 20. Instead, this is included in the failure detection execution conditions in step S114. In step S114, it is determined that the failure detection execution conditions are fulfilled when the following conditions are all fulfilled, for example: (i) The engine 10 is not in operation; (ii) The drive power command from the hybrid vehicle 1 is 0; and (iii) The electric power that can be supplied to the EHC device 82 is higher than a predetermined value.

The reason for condition (i) is that fluctuation of power consumption of the auxiliary machines 70 that may occur when the engine 10 is in operation can adversely affect the accuracy of estimation of the EHC current using a detection value from the current sensor 110. If the fluctuation of power consumption of the auxiliary machines 70 is small when the engine 10 is idling, the condition (i) may be changed as follows: The engine 10 is not in operation or is idling.

The reason for condition (ii) is that the accuracy of estimation of the EHC current using a detection value from the current sensor 110 may be adversely affected by a current that flows from the electric storage device 40 to the motor generator 20 when the drive power command is positive.

The reason for condition (iii) is that the output electric power of the electric storage device 40 may reach its upper limit because of the power supply from the electric storage device 40 to the EHC 85 and the engine 10 may be started or the supply of electric power to other components than the EHC 85 may be limited when the electric power that can be supplied from the electric storage device 40 to the EHC device 82 falls below a predetermined value (the rated power of the EHC 85, for example).

After executing step S116, the ECU 100 controls the EHC power supply 90 so that predetermined failure detection electric power can be supplied to the EHC 85 (step S118). In other words, in this failure detection processing 1, a relatively small amount of electric power only for detection of a failure of the EHC current sensor 130 (electric power for failure detecting) is supplied to the EHC 85 while failure detection is executed.

Then, the ECU 100 acquires detection values from the current sensor 110, which detects an input/output current of the electric storage device 40, and the current sensors 115 and 125 (step S120). Then, the ECU 100 calculates an estimated value of the EHC current that is supplied to the EHC device 82 using the detection values that have been acquired in step S120 (step S122).

Specifically, the ECU 100 calculates an input current of the DC/DC converter 65 from the detection value from the current sensor 125, and calculates an estimated value of the EHC current by subtracting the calculated input current of the DC/DC converter 65 and the detection value from the current sensor 115 from the detection value from the current sensor 110. The input current of the DC/DC converter 65 is calculated by multiplying the detection value from the current sensor 125 by the output voltage of the DC/DC converter 65 and dividing the resulting value by the input voltage of the DC/DC converter 65. The output voltage of the DC/DC converter 65 may be detected by a voltage sensor (not shown) or may be an output voltage command value for the DC/DC converter 65. As the input voltage of the DC/DC converter 65, a detected voltage value of the electric storage device 40 can be used.

Then, the ECU 100 acquires a detection value from the EHC current sensor 130 (step S124). Then, the ECU 100 determines whether the absolute value of the difference between the detection value from the EHC current sensor 130, which has been detected in step S124, and the estimated value of the EHC current, which has been calculated in step S122, is greater than a predetermined threshold value (step S126). The threshold value is a determination value that is used to determine that the EHC current sensor 130 has a failure when there is a difference between the detection value from the EHC current sensor 130 and the estimated value of the EHC current that is calculated using a detection value from the current sensor 110.

In other words, if it is determined in step S126 that the absolute value of the difference between the detection value from the EHC current sensor 130 and the estimated value of the EHC current that has been calculated using a detection value from the current sensor 110 is greater than the threshold value (YES in step S126), the ECU 100 determines that the EHC current sensor 130 has a failure (step S128). After that, the ECU 100 returns the currents to the other components, which have been reduced in step S116, to the original level (step S130).

If it is determined in step S126 that the absolute value of the difference between the detection value from the EHC current sensor 130 and the estimated value of the EHC current is not greater than the threshold value (NO in step S126), the ECU 100 determines that the EHC current sensor 130 is in a normal state and advances the processing to step S130.

Figure 6:
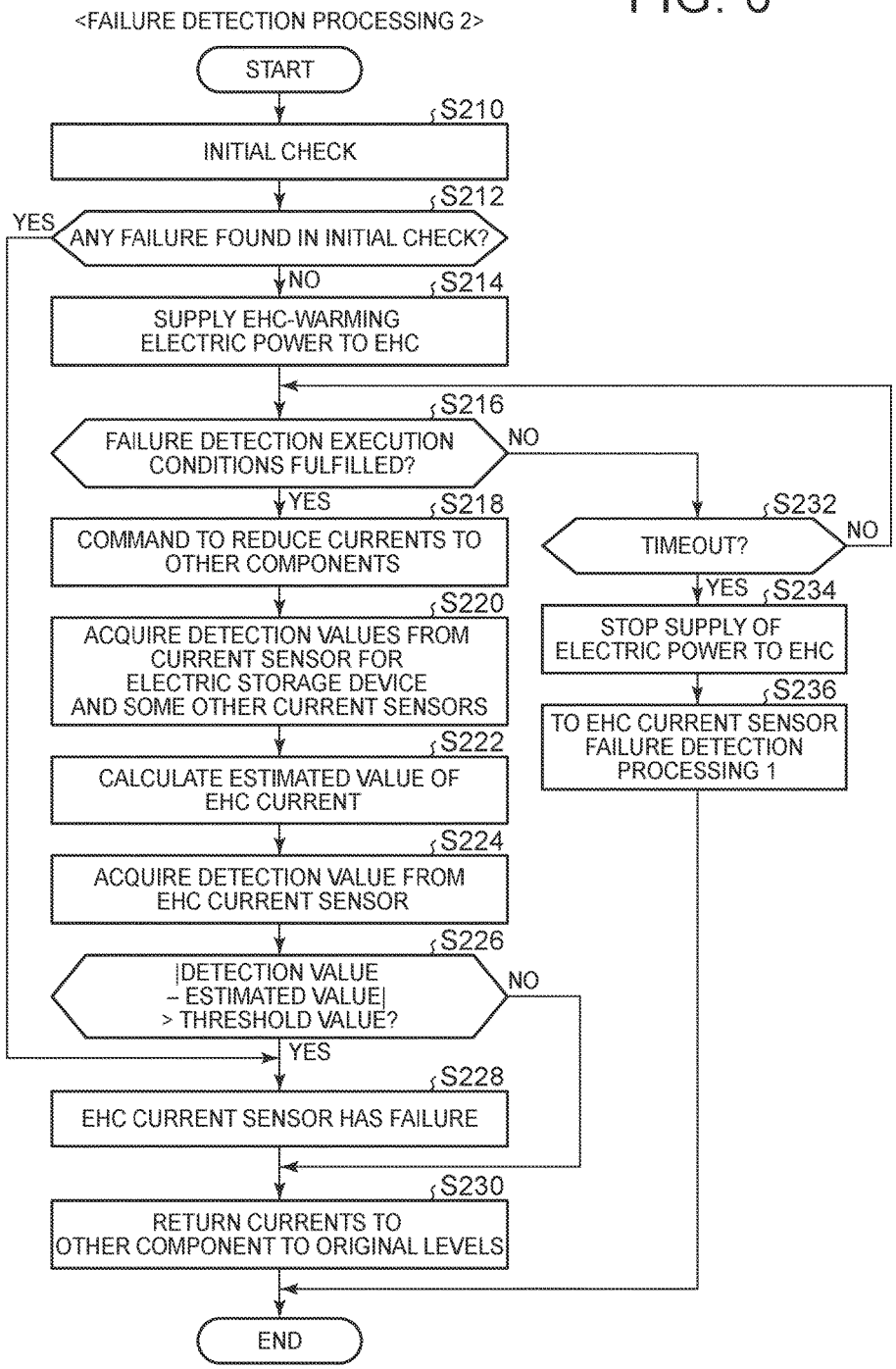
FIG. 6 is a flowchart that illustrates the procedure of failure detection processing 2 that is executed in steps S18 and S28 in FIG. 4.

FIG. 6 is a flowchart that illustrates the procedure of failure detection processing 2 that is executed in steps S18 and S28 in FIG. 4. Referring to FIG. 6, the ECU 100 performs an initial check on the EHC current sensor 130 (step S210) and determines whether there is any failure found in the initial check (step S212). Steps S210 and S212 are the same as steps S110 and S112, respectively, in the failure detection processing 1 in FIG. 5.

If it is determined in step S212 that there is no failure found in the initial check (NO in step S212), the ECU 100 controls the EHC power supply 90 so that predetermined EHC-warming electric power can be supplied to the EHC 85 (step S214). In this failure detection processing 2, a failure of the EHC current sensor 130 is detected while the EHC 85 is warmed up. In contrast to the failure detection processing 1, which is executed only for the failure detection, electric power is supplied to the EHC 85 regardless of whether failure detection execution conditions are fulfilled. In this failure detection processing 2, a larger amount of electric power (EHC-warming electric power) than that which is supplied during the failure detection processing 1 is supplied to the EHC 85 so that failure detection can be executed while the EHC 85 is warmed up as described above.

Then, the ECU 100 determines whether the failure detection execution conditions are fulfilled (step S216). Then, if it is determined that the failure detection execution conditions are fulfilled (YES in step S216), the ECU 100 generates commands to reduce the currents that are supplied from the electric storage device 40 to other components except the EHC 85 (step S218). Because steps S216 and S218 are the same as steps S114 and S116, respectively, in the failure detection processing 1 in FIG. 5, redundant description is not repeated.

After that, the ECU 100 advances the processing to step S220. Because steps S220 to S230 are the same as steps S120 to S130, respectively, in the failure detection processing 1 in FIG. 5, redundant description is not repeated.

If it is determined in step S216 that the failure detection execution conditions are not fulfilled (NO in step S216), the ECU 100 determines whether a timeout has occurred since a predetermined period of time has passed after the supply of electric power to the EHC 85 is started in in step S214 (step S232). In this failure detection processing 2, EHC-warming electric power is supplied to the EHC 85 to warm up the EHC 85 regardless of whether the failure detection execution conditions are fulfilled. However, a predetermined rated time is provided for the supply of the warming electric power to the EHC 85 and the above predetermined period of time is set equal to this rated time.

If it is determined that no timeout has occurred (NO in step S232), the ECU 100 returns the processing to step S216. If it is determined that a timeout has occurred since the failure detection execution conditions are not fulfilled (YES in step S232), the ECU 100 controls the EHC power supply 90 so that the supply of electric power to the EHC 85 can be stopped (step S234).

After that, the ECU 100 executes the failure detection processing 1 in FIG. 5 (step S236). When the failure detection processing 2 is terminated before the processing in and after step S218 is not executed because a timeout has occurred, there is no need to warm up the EHC 85 (the EHC 85 has been warmed up). Thus, the failure detection processing 1, in which a relatively small amount of electric power only for detection of a failure of the EHC current sensor 130 (failure detection electric power) is supplied to the EHC 85 while failure detection is executed, is executed.

The failure detection processing 1 or 2 is executed when the CD mode, in which the engine 10 is used less frequently, has been selected (YES in step S10 in FIG. 4), or when the engine 10 is not in operation (NO in step S22 or YES in step S24 in FIG. 4) when the CS mode has been selected. However, the engine 10 can be started in response to an accelerator operation by the user, for example, while the failure detection processing 1 or 2 is being executed. In such a case, the ECU 100 terminates (resets) the failure detection processing that is being executed, and executes the failure determination control in FIG. 4 again after the engine 10 is stopped.

Figure 7:
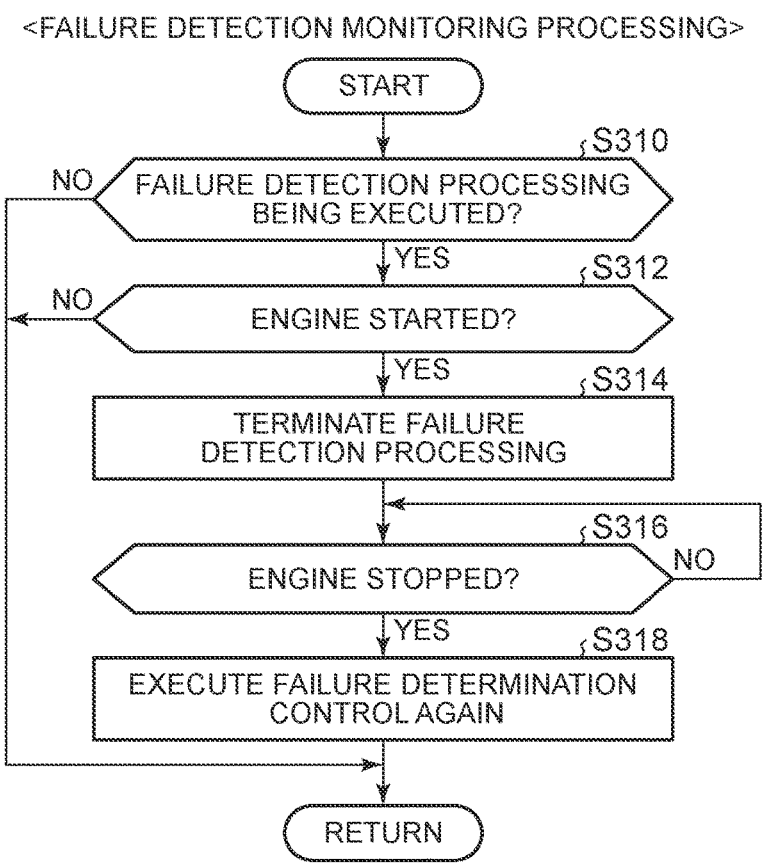
FIG. 7 is a flowchart that illustrates the procedure of failure detection monitoring processing.

FIG. 7 is a flowchart that illustrates the procedure of failure detection monitoring processing. The processing that is shown in this flowchart is repeatedly executed at predetermined intervals when the hybrid vehicle 1 is in a ready-ON state.

Referring to FIG. 7, the ECU 100 determines whether the failure detection processing 1 in FIG. 5 or the failure detection processing 2 in FIG. 6 is being executed (step S310). If neither the failure detection processing 1 nor the failure detection processing 2 is being executed (NO in step S310), the ECU 100 advances the processing to return without executing the following steps.

If it is determined in step S310 that the failure detection processing 1 or 2 is being executed (YES in step S310), the ECU 100 determines whether the engine 10 has been started (step S312). If the engine 10 has not been started (NO in step S312), the ECU 100 advances the processing to return.

If it is determined in step S312 that the engine 10 has been started (YES in step S312), the ECU 100 terminates the failure detection processing being executed (step S314). After that, the ECU 100 determines whether the engine 10 has been stopped (step S316). Then, if it is determined that the engine 10 has been stopped (YES in step S316), the ECU 100 starts the failure determination control in FIG. 4 again from the beginning (step S318).

As described above, in this first embodiment, the current that is supplied to the EHC device 82 is estimated using a detection value from the current sensor 110, which detects an input/output current of the electric storage device 40, and the estimated value is compared with a detection value from the EHC current sensor 130 to detect a failure of the EHC current sensor 130. Thus, there is no need to make the EHC current sensor redundant for detection of a failure of the EHC current sensor 130. According to this first embodiment, a failure of the EHC current sensor 130 can be detected without making the EHC current sensor redundant.

In addition, according to this first embodiment, a failure of the EHC current sensor 130 is detected differently for the two modes (CD mode/CS mode) with different conditions for starting the engine 10. Moreover, the necessity for warm-up of the EHC 85 is determined in the failure detection processing in a way suitable for each mode (CD mode/CS mode), and the failure detection processing 1 or 2 is executed as needed. In the failure detection processing 2, a failure of the EHC current sensor 130 can be detected while the EHC 85 is warmed up. In the failure detection processing 1, failure detection can be executed with less electric power than in the failure detection processing 2 to reduce power consumption.

Second Embodiment

While the EHC 85 is electrically connected to the low voltage side of the boost converter 55 via the EHC power supply 90 in the first embodiment, the EHC 85 is electrically connected to the high voltage side of the boost converter 55 in this second embodiment.

Figure 8:
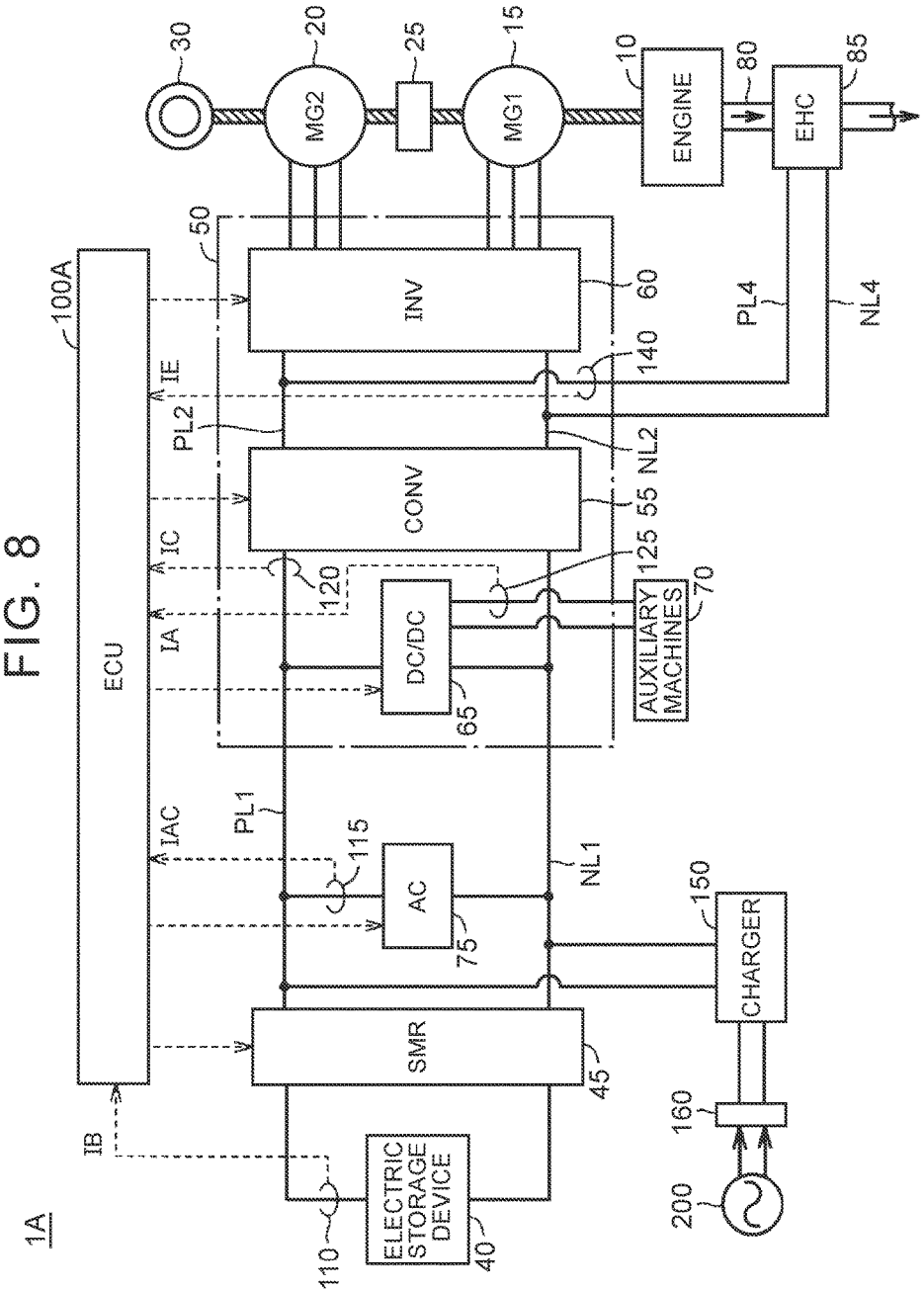
FIG. 8 is an overall configuration diagram of a hybrid vehicle according to a second embodiment.

FIG. 8 is an overall configuration diagram of a hybrid vehicle according to a second embodiment. Referring to FIG. 8, a hybrid vehicle 1A has the same configuration as the hybrid vehicle 1 according to the first embodiment in FIG. 1 except that it does not include the EHC power supply 90 and includes a current sensor 140 instead of the current sensor 130 and an ECU 100A instead of the ECU 100.

The EHC 85 is connected to the paired power lines PL2 and NL2 via paired power lines PL4 and NL4, and is supplied with electric power from the electric storage device 40 through the boost converter 55, the paired power lines PL2 and NL2, and the paired power lines PL4 and NL4.

The current sensor 140 detects a current IE that is supplied from the paired power lines PL4 and NL4 to the EHC 85, and outputs a detection value corresponding to the current IE to the ECU 100A. In other words, the current sensor 140 is an EHC current sensor that detects a current IE that is supplied to the EHC 85 (the current sensor 140 may be hereinafter referred to also as "the EHC current sensor 140").

The ECU 100A executes failure determination control to determine whether the EHC current sensor 140, which detects a current IE that is supplied to the EHC 85, has a failure. In this second embodiment, the EHC 85 is electrically connected to the high voltage side of the boost converter 55, and a current sensor 120 that detects a current that is supplied from the electric storage device 40 through the paired power lines PL1 and NL1 to the boost converter 55 is provided on the input side (low voltage side) of the boost converter 55.

Thus, in the hybrid vehicle 1A according to this second embodiment, the ECU 100A estimates an EHC current that is supplied from the electric storage device 40 to the EHC 85 using a detection value from the existing current sensor 120, which detects a current that is supplied from the electric storage device 40 to the boost converter 55. Then, the ECU 100A compares the estimated value of the EHC current and the detection value from the EHC current sensor 140, and determines that the EHC current sensor 140 has a failure if there is a difference between the estimated value and the detection value. This configuration makes it possible to detect a failure of the EHC current sensor 140 without making the EHC current sensor 140 redundant. In the following, the failure determination control that is executed by the ECU 100A to determine whether the EHC current sensor 140 had a failure is described.

The processing procedure of the failure determination control that is executed by the ECU 100A to determine whether the EHC current sensor 140 has a failure is the same as that of the first embodiment in FIG. 4 as a whole. In the failure determination control of this second embodiment, the procedure of the failure detection processing 1 in step S14 and S26 and the procedure of the failure detection processing 2 in step S18 and S28 are different from the failure determination control of the first embodiment in FIG. 4.

FIG. 9 is a flowchart that illustrates the procedure of the failure detection processing 1 that is executed in the second embodiment. Because steps S410 to S414 and steps S426 and S428 in FIG. 9 are the same as steps S110 to S114 and steps S126 and S128, respectively, in the failure detection processing 1 of the first embodiment in FIG. 5, redundant description is not repeated.

If it is determined in step S414 that the failure detection execution conditions are fulfilled (YES in step S414), the ECU 100A controls the boost converter 55 so that predetermined failure detection electric power can be supplied to the EHC 85 (step S418). Specifically, the ECU 100A controls the boost converter 55 so that the output voltage of the boost converter 55 can be equal to the rated voltage of the EHC 85. When failure detection processing is executed, the output voltage of the boost converter 55 does not change even if the motor generators 15 and/or 20 are operated since the engine 10 is not in operation and the required drive power is 0.

Then, the ECU 100A acquires a detection value from the current sensor 120, which detects a current that is supplied from the electric storage device 40 to the boost converter 55 (step S420). Then, the ECU 100A calculates an estimated value of the EHC current that is supplied to the EHC 85 using the detection value from the current sensor 120 (step S422). Specifically, the ECU 100A uses the detection value from the current sensor 120 as the estimated value of the EHC current. Then, the ECU 100A acquires a detection value from the EHC current sensor 140 (step S424). After that, the ECU 100A advances the processing to step S426.

FIG. 10 is a flowchart that illustrates the procedure of the failure detection processing 2 that is executed in the second embodiment. Because steps S510 to S516, steps S526 and S528 and steps S532 to S536 in FIG. 10 are the same as steps S210 to S216, steps S226 and S228 and steps S232 to S236, respectively, in the failure detection processing 2 of the first embodiment in FIG. 6, redundant description is not repeated.

If it is determined in step S516 that the failure detection execution conditions are fulfilled (YES in step S516), the ECU 100A acquires a detection value from the current sensor 120 (step S520). Then, the ECU 100A calculates an estimated value of the EHC current that is supplied to the EHC 85 using the detection value from the current sensor 120 (step S522). Specifically, the ECU 100A uses the detection value from the current sensor 120 as the estimated value of the EHC current. Then, the ECU 100A acquires a detection value from the EHC current sensor 140 (step S524). After that, the ECU 100A advances the processing to step S526.

Again according to this second embodiment, a failure of the EHC current sensor 140 can be detected without making the EHC current sensor 140 redundant as in the first embodiment. In addition, a failure of the EHC current sensor 140 can be detected in a way suitable for the selected mode (CD mode/CS mode).

While the EHC current is estimated using a detection value from the current sensor 120, which detects a current that is supplied to the boost converter 55, in the above second embodiment, the EHC current may be estimated using a detection value from the current sensor 110, which detects an input current of the electric storage device 40, in a configuration in which the EHC 85 is electrically connected to the high voltage side of the boost converter 55 in the same manner as in the first embodiment. In this case, the processing procedures of the failure detection processing 1 and 2 are basically the same as those of the failure detection processing 1 and 2 of the first embodiment in FIGS. 5 and 6, respectively.

While the EHC current sensor 130 is provided on the input side of the EHC power supply 90 in the above first embodiment, the EHC current sensor 130 may be provided on the output side of the EHC power supply 90. In this case, when a detection value from the EHC current sensor 130 is converted into a current value on the input side of the EHC power supply 90 using the voltage conversion ratio of the EHC power supply 90, or an estimated value of the EHC current that is calculated using a detection value from the current sensor 120 is converted into a current value on the output side of the EHC power supply 90, a detection value can be compared with an estimated value.

In each of the above embodiments, the hybrid vehicle 1 or 1A is a hybrid vehicle with a configuration in which the engine 10 and the motor generators 15 and 20 are connected by the power split device 25. However, the hybrid vehicles to which this disclosure is applicable are not limited to hybrid vehicles with such a configuration. For example, this disclosure is applicable to what is called a series type hybrid vehicle. When the hybrid vehicle 1 or 1A is a series type hybrid vehicle, the engine 10 is used only for driving the motor generator 15 and power for propelling the vehicle is generated only by the motor generator 20.

While the hybrid vehicle 1 or 1A is a vehicle that includes the electric storage device 40, which can be externally charged from an external power supply 200, in each of the above embodiments, this disclosure is also applicable to hybrid vehicles without external charging means (the charger 150 and the power receiving section 160). The CD mode and CS mode are desirable for externally chargeable hybrid vehicles, but are not necessarily limited to externally chargeable hybrid vehicles.

In the foregoing, the EHC current sensors 130 and 140 correspond to one example of the "first current sensor", and the current sensor 110 corresponds to one example of the "second current sensor that detects an input/output current of the electric storage device". The current sensor 120 corresponds to one example of the "second current sensor that detects a current that is supplied from the electric storage device to the converter", and the ECUs 100 and 100A correspond to one example of the "controller".

It should be understood that the embodiments that are disclosed herein are not restrictive but illustrative in all aspects. The scope of the invention is defined by the appended claims rather than by the above description of embodiments, and all changes that fall within the meaning and range of equivalents of the claims are intended to be embraced thereby.

What is claimed is:

1. A hybrid vehicle that is equipped with an internal combustion engine and an electric motor generating a driving force, comprising:
    an electric storage device configured to store electric power that is supplied to the electric motor;
    an electrically heated catalyst device that includes a catalyst that purifies exhaust gas from the internal combustion engine, and is configured to be supplied with electric power from the electric storage device to electrically heat the catalyst;
    a first current sensor configured to detect a current that is supplied to the electrically heated catalyst device;
    a second current sensor configured to detect an input/output current of the electric storage device; and
    a controller configured to execute failure determination control that estimates a current that is supplied to the electrically heated catalyst device using a detection value of the second current sensor and compares the estimated current with a detection value of the first current sensor to determine whether the first current sensor has a failure,
    wherein the hybrid vehicle can run either in a Charge Depleting mode or a Charge Sustaining mode,
    wherein the failure determination control includes first processing that is executed only:
      (i) when the hybrid vehicle is in the Charge Depleting mode and when the electric storage device has a state of charge that is lower than a predetermined level and the catalyst of the electrically heated catalyst device has a temperature that is lower than a predetermined value, or
      (ii) when the hybrid vehicle is in the Charge Sustaining mode and when the catalyst has a temperature that is lower than the predetermined value and the internal combustion engine is not in operation, and
    wherein, in the first processing, the controller controls electric power that is supplied to the electrically heated catalyst device so that first electric power that is required to determine whether the first current sensor has the failure while the electrically heated catalyst device is warmed up is supplied.

2. The hybrid vehicle according to claim 1,
    wherein the failure determination control further includes second processing that is executed when the hybrid vehicle is in the Charge Depleting mode and when the electric storage device has a state of charge that is equal to or higher than the predetermined level, or when the hybrid vehicle is in the Charge Sustaining mode and when the catalyst has a temperature that is equal to or higher than the predetermined value, and
    wherein, in the second processing, the controller controls electric power that is supplied to the electrically heated catalyst device so that second electric power that is less than the first electric power is supplied.

3. The hybrid vehicle according to claim 1,
wherein the electrically heated catalyst device is connected to a power line that connects a converter and an inverter.

4. The hybrid vehicle according to claim 3,
wherein the failure determination control further includes second processing that is executed when the hybrid vehicle is in the Charge Depleting mode and when the electric storage device has a state of charge that is equal to or higher than the predetermined level, or when the hybrid vehicle is in the Charge Sustaining mode and when the catalyst has a temperature that is equal to or higher than the predetermined value, and
wherein, in the second processing, the controller controls electric power that is supplied to the electrically heated catalyst device so that second electric power that is less than the first electric power is supplied.

5. A hybrid vehicle that is equipped with an internal combustion engine and an electric motor generating a driving force, comprising:
an electric storage device configured to store electric power that is supplied to the electric motor;
an electrically heated catalyst device that includes a catalyst that purifies exhaust gas from the internal combustion engine, and is configured to be supplied with electric power from the electric storage device to electrically heat the catalyst;
a first current sensor configured to detect a current that is supplied to the electrically heated catalyst device;
a second current sensor configured to detect an input/output current of the electric storage device; and
a controller configured to execute failure determination control that estimates a current that is supplied to the electrically heated catalyst device using a detection value of the second current sensor and compares the estimated current with a detection value of the first current sensor to determine whether the first current sensor has a failure,
wherein the hybrid vehicle can run either in a Charge Depleting mode or a Charge Sustaining mode,
wherein the failure determination control includes first processing that is executed when the hybrid vehicle is in the Charge Depleting mode and when the electric storage device has a state of charge that is lower than a predetermined level and the catalyst of the electrically heated catalyst device has a temperature that is lower than a predetermined value, and second processing that is executed when the hybrid vehicle is in the Charge Depleting mode and when the electric storage device has a state of charge that is equal to or higher than the predetermined level,
wherein, in the first processing, the controller controls electric power that is supplied to the electrically heated catalyst device so that first electric power that is required to determine whether the first current sensor has the failure and to warm up the electrically heated catalyst device is supplied, and
wherein, in the second processing, the controller controls electric power that is supplied to the electrically heated catalyst device so that second electric power that is less than the first electric power is supplied.

6. The hybrid vehicle according to claim 5,
wherein the electrically heated catalyst device is connected to a power line that connects a converter and an inverter.

7. A hybrid vehicle that is equipped with an internal combustion engine and an electric motor generating a driving force, comprising:
an electric storage device configured to store electric power that is supplied to the electric motor;
an electrically heated catalyst device that includes a catalyst that purifies exhaust gas from the internal combustion engine, and is configured to be supplied with electric power from the electric storage device to electrically heat the catalyst;
a first current sensor configured to detect a current that is supplied to the electrically heated catalyst device;
a second current sensor configured to detect an input/output current of the electric storage device; and
a controller configured to execute failure determination control that estimates a current that is supplied to the electrically heated catalyst device using a detection value of the second current sensor and compares the estimated current with a detection value of the first current sensor to determine whether the first current sensor has a failure,
wherein the hybrid vehicle can run either in a Charge Depleting mode or a Charge Sustaining mode,
wherein the failure determination control includes first processing that is executed when the hybrid vehicle is in the Charge Sustaining mode and when the catalyst of the electrically heated catalyst device has a temperature that is lower than a predetermined value and the internal combustion engine is not in operation, and second processing that is executed when the hybrid vehicle is in the Charge Sustaining mode and when the catalyst has a temperature that is equal to or higher than the predetermined value,
wherein, in the first processing, the controller controls electric power that is supplied to the electrically heated catalyst device so that first electric power that is required to determine whether the first current sensor has the failure and to warm up the electrically heated catalyst device is supplied, and
wherein, in the second processing, the controller controls electric power that is supplied to the electrically heated catalyst device so that second electric power that is less than the first electric power is supplied.

8. The hybrid vehicle according to claim 7,
wherein the electrically heated catalyst device is connected to a power line that connects a converter and an inverter.

* * * * *